(12) United States Patent
Tahara et al.

(10) Patent No.: US 8,551,246 B2
(45) Date of Patent: Oct. 8, 2013

(54) METHOD FOR EVALUATING OXIDE DIELECTRIC BREAKDOWN VOLTAGE OF A SILICON SINGLE CRYSTAL WAFER

(75) Inventors: Fumio Tahara, Annaka (JP); Tsuyoshi Ohtsuki, Annaka (JP); Takatoshi Nagoya, Annaka (JP); Kiyoshi Mitani, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 232 days.

(21) Appl. No.: 12/990,038

(22) PCT Filed: May 7, 2009

(86) PCT No.: PCT/JP2009/002002
§ 371 (c)(1),
(2), (4) Date: Oct. 28, 2010

(87) PCT Pub. No.: WO2010/001518
PCT Pub. Date: Jan. 7, 2010

(65) Prior Publication Data
US 2011/0045246 A1 Feb. 24, 2011

(30) Foreign Application Priority Data
Jul. 2, 2008 (JP) ................................. 2008-173142

(51) Int. Cl.
*C30B 15/20* (2006.01)

(52) U.S. Cl.
USPC ............ 117/14; 117/3; 117/7; 117/9; 117/11; 117/13; 117/15; 117/19; 117/20; 117/21; 117/84; 117/85; 117/86; 117/88; 117/89; 117/90; 117/91; 117/92; 117/93; 117/94; 117/101; 117/105; 117/106

(58) Field of Classification Search
USPC ........... 117/3, 7, 9, 11, 13–15, 19–21, 84–86, 117/88–94, 101, 105–106, 200–202, 928, 117/930–932
See application file for complete search history.

(56) References Cited

U.S. PATENT DOCUMENTS 5,225,366 A * 7/1993 Yoder ............................. 117/90
6,066,571 A * 5/2000 Usuda et al. .................. 438/745
(Continued)

FOREIGN PATENT DOCUMENTS

JP  06-140377  * 5/1994
JP  A-6-140377    5/1994
(Continued)

OTHER PUBLICATIONS

International Search Report issued in Application No. PCT/JP2009/002002; dated Jul. 28, 2009.
(Continued)

*Primary Examiner* — Michael Kornakov
*Assistant Examiner* — Kenneth A Bratland, Jr.
(74) *Attorney, Agent, or Firm* — Oliff & Berridge, PLC (57) ABSTRACT

A method for manufacturing a silicon single crystal wafer, having at least: a step of preparing a silicon single crystal ingot; a step of slicing the silicon single crystal ingot to fabricate a plurality of sliced substrates; a processing step of processing the plurality of sliced substrates into a plurality of substrates by performing at least one of lapping, etching, and polishing; a step of sampling at least one from the plurality of substrates; a step of measuring surface roughness of the substrate sampled at the sampling step by an AFM and obtaining an amplitude (an intensity) of a frequency band corresponding to a wavelength of 20 nm to 50 nm to make a judgment of acceptance; and a step of sending the substrate to the next step if a judgment result is acceptance or performing reprocessing if the judgment result is rejection.

5 Claims, 7 Drawing Sheets

(56) References Cited

U.S. PATENT DOCUMENTS

| | | | |
|---|---|---|---|
| 6,284,552 B1 | 9/2001 | Yamagata et al. | |
| 7,056,789 B2 * | 6/2006 | Shiono et al. | 438/257 |
| 7,151,046 B2 | 12/2006 | Takeda et al. | |
| 2002/0070427 A1 * | 6/2002 | Kobayashi et al. | 257/617 |

FOREIGN PATENT DOCUMENTS

| | | |
|---|---|---|
| JP | A-7-66250 | 3/1995 |
| JP | A-10-208988 | 8/1998 |
| JP | A-11-148812 | 6/1999 |
| JP | A-11-162972 | 6/1999 |
| JP | A-2000-208578 | 7/2000 |
| JP | A-2005-129769 | 5/2005 |
| JP | A-2006-40961 | 2/2006 |
| JP | A-2008-94649 | 4/2008 |

OTHER PUBLICATIONS

Jan. 11, 2012 Office Action issued in Chinese Application No. 200980116228.4 (with partial translation).

International Preliminary Report on Patentability issued in Application No. PCT/JP2009/002002; Dated Feb. 17, 2011.

Japanese Office Action issued in Japanese Application No. 2008-173142 dated Jul. 24, 2012 (w/ partial translation).

Jun. 25, 2013 Taiwanese Office Action issued in Taiwanese Application No. 098115889 with partial English-language translation.

* cited by examiner

FIG. 7

METHOD FOR EVALUATING OXIDE DIELECTRIC BREAKDOWN VOLTAGE OF A SILICON SINGLE CRYSTAL WAFER

TECHNICAL FIELD

The present invention relates to a silicon single crystal wafer and to a manufacturing method, and an evaluating method thereof, and more specifically to a silicon single crystal wafer in which an oxide dielectric breakdown voltage (GOI) is not degraded even though a film thickness of a gate oxide film is as small as approximately 5 nm and to a manufacturing method, and an evaluating method thereof.

BACKGROUND ART

In a CMOS and others in recent years, greatly reducing a thickness of an oxide film, e.g., reducing a thickness of a gate oxide film to several nm has been demanded. In such a thin oxide film, irregularities on a wafer surface are similarly transferred as irregularities of the oxide film even after the oxide film is formed.

Therefore, degradation in GOI that is not detected when GOT evaluation is measured in a conventional wafer having an oxide film thickness of 25 nm (an SEMI standard) is detected in such a thin gate oxide film as described above. In regard to the GOI, since uniformity is improved as flatness of a wafer surface is increased, the wafer surface must be flattened as much as possible (see Japanese Patent Application Laid-open No. 6-140377).

For example, the GOI of a wafer that is measured in an oxide film of 10 nm or below is dependent on surface roughness, and a wafer is considered to have no degradation in GOI when an Ra value measured by an AFM (an atomic force microscope) is not greater than 0.1 nm.

DISCLOSURE OF INVENTION

With an improvement in evaluation technology, a GOI evaluation technology when an oxide film thickness is several nm has been also recently established. However, when evaluating the GOI of a silicon single crystal wafer having a thin oxide film based on this new evaluation technology, occurrence of degradation in the GOI can be observed in some wafers even though an Ra value is small.

For example, in a defect-free silicon single crystal wafer whose entire surface consists of an N region and a nitrogen-doped silicon single annealed wafer that have substantially the same Ra, a difference in charge amount (Qbd) leading to dielectric breakdown is hardly observed when the evaluation is performed based on a TDDB method in a case where a gate oxide film thickness is 25 nm, but a Qbd value greatly differs in an intrinsic region of each wafer in a case where the gate oxide film thickness is 5 nm, and it has been revealed that the nitrogen-doped silicon single crystal annealed wafer has a smaller Qbd value than that in the defect-free silicon single crystal wafer. Further, the Qbd value may not be degraded even in a wafer having Ra of 0.1 nm or above.

Here, the TDDB (Time Dependent Dielectric Breakdown) method means a method of continuously applying a fixed voltage or current to an insulator film, detecting a current or a voltage at predetermined time intervals to obtain a change with time, and evaluating a time, passage and others taken until dielectric breakdown occurs.

As described above, even in a wafer having a small Ra value, degradation in GOI can be observed if a gate oxide film has a small thickness. That is, it has been revealed that an Ra value and degradation in GOI seem to have no perfect correlation if a gate oxide film has a small thickness. Then, the degradation in GOI cannot be perfectly evaluated unless an MOS structure is actually formed on a surface and evaluated, but since this method takes a lot of trouble and a destructive inspection is performed, a cost is high.

In view of the above-described problem, it is an object of the present invention to provide a silicon single crystal wafer having no degradation in GOI even if a thickness of a gate oxide film is as small as several nm, a manufacturing method thereof, and an evaluating method that can easily perform evaluation of no degradation in GOI when a gate oxide film is thin as compared with the TDDB method and others.

To achieve this object, according to the present invention, there is provided a silicon single crystal wafer, wherein, at the time of measuring surface roughness on a surface of the silicon single crystal wafer by using an AFM, an amplitude (an intensity) of a frequency band corresponding to a wavelength of 20 nm to 50 nm meets a relationship of $y<0.00096e^{-15x}$, where X (nm$^{-1}$) is a frequency and y (nm$^2$) is the amplitude (the intensity) when a waveform of a measurement value obtained by measuring the surface roughness by the AFM is subjected to Fourier transformation.

Particulars will be described later, GOI when a gate oxide film has a thickness of several nm is dependent on surface roughness, but it was revealed that GOI is not simply indicated by an Ra value but is dependent on an amplitude (an intensity) of a frequency band corresponding to a wavelength of 20 nm to 50 nm. Further, in case of the silicon single crystal wafer that meets the relationship of $y<0.00096e^{-15X}$ when a waveform at the time of measuring surface roughness by using the AFM is Fourier-transformed and X (nm$^{-1}$) is a frequency whilst y (nm$^2$) is the amplitude, the silicon single crystal wafer in which degradation in GOI is greatly suppressed can be provided even though the gate oxide film is as thin as several nm.

Furthermore, the silicon single crystal wafer can be subjected to annealing in a vertical heat-treating furnace.

It is often the case that a thickness of an oxide film formed on a surface of the wafer subjected annealing in the vertical heat-treating furnace is small and uneven when taken out from the heat-treating furnace. Moreover, in the wafer having such an uneven oxide film, even silicon is etched at a position where the oxide film is partially thin, and hence surface roughness is degraded when the oxidation film is etched in cleaning after annealing. Additionally, this degradation in surface roughness greatly affects when the gate oxide film becomes thinner. However, in the silicon single crystal wafer according to the present invention, degradation in GOI is greatly suppressed even though the gate oxide film is thin, and the degradation in GOI can be suppressed even though an uneven oxide film is apt to be formed on the surface in the vertical heat-treating furnace.

Further, according to the present invention, there is provided a method for manufacturing a silicon single crystal wafer, comprising at least: a step of preparing a silicon single crystal ingot; a step of slicing the silicon single crystal ingot to fabricate a plurality of sliced substrates; a processing step of processing the plurality of sliced substrates into a plurality of substrates by performing at least one of lapping, etching, and polishing; a step of sampling at least one from the plurality of substrates; a step of measuring surface roughness of the substrate sampled at the sampling step by an AFM and obtaining an amplitude (an intensity) of a frequency band corresponding to a wavelength of 20 nm to 50 nm to make a judgment of acceptance; and a step of sending the substrate to the next step if a judgment result is acceptance or performing reprocessing if the judgment result is rejection.

As described above, although GOI when the gate oxide film has a thickness of several nm is dependent on surface roughness, GOI is not simply indicated by an Ra value but it is dependent on an amplitude (an intensity) of a frequency band corresponding to a wavelength of 20 nm to 50 nm. Furthermore, when manufacturing the silicon single crystal wafer, at least one substrate is sampled from the plurality of substrates, surface roughness of the sampled substrate is measured by using the AFM to obtain an amplitude (an intensity) of a frequency band corresponding to a wavelength of 20 nm to 50 nm, and a judgment of acceptance is made. Moreover, the substrates that have remained at the time of sampling are sent to the next processing step if a judgment result is acceptance, or the remaining substrates are again processed if the judgment result is rejection, thereby assuredly manufacturing the silicon single crystal wafer having no degradation in GOI even though the gate oxide film is thin.

At this time, it is preferable that the judgment of acceptance result is acceptance if a relationship of $y<0.00096e^{-15X}$ is met or the judgment of acceptance result is rejection if the relationship is not met, where X (nm$^{-1}$) is a frequency and y (nm$^2$) is the amplitude (the intensity) when a waveform of a measurement value obtained by measuring the surface roughness by using the AFM is subjected to Fourier transformation.

In the silicon single crystal wafer that the amplitude y meets the relationship $y<0.00096e^{-15X}$ when the waveform of the measurement value obtained by measuring the surface roughness by the AFM is Fourier-transformed and X (nm$^{-1}$) is the frequency whilst y (nm$^2$) is the amplitude (the intensity), since GOI is not degraded even though the gate oxide film is as thin as several nm, whether the manufactured silicon single crystal wafer has no degradation in GOI can be readily judged during the process by making a judgment of acceptance/rejection based on whether this relational expression is met. Therefore, the degradation in GOI is suppressed in the manufactured silicon single crystal wafer.

Moreover, it is preferable for the reprocessing to be processing of forming a sacrificial oxide film on each of the plurality of processed substrates and then removing the sacrificial oxide film by using an HF solution.

When the sacrificial oxide film is formed and removed by the HF solution, the uneven oxide film on, e.g., an annealed processed substrate surface can be completely and easily removed. Additionally, forming the sacrificial oxide film enables alleviating a surface shape. Therefore, the amplitude (the intensity) of the frequency band corresponding to a wavelength of 20 nm to 50 nm can be improved, a rejected substrates are not discarded even if a first judgment result is rejection, and the silicon single crystal wafer in which the degradation in GOI is suppressed by reprocessing can be provided.

Further, it is preferable for an annealing heat treatment to be carried out in a vertical heat-treating furnace between the processing step and the sampling step.

Usually, in a substrate annealed in the vertical heat-treating furnace, a thickness of an oxide film formed on a surface thereof when taken out from the heat-treating furnace is apt to become thin and uneven. Furthermore, when the substrate having such an uneven oxide film is cleaned after annealing, even silicon at a partially thin portion is also etched at the time of etching this uneven oxide film, and hence surface roughness is degraded to affect GOI.

However, according to the manufacturing method of the present invention, the silicon single crystal wafer that has been annealed in the vertical heat-treating furnace and has degradation in GOI suppressed therein alone can be sent to the next step. Moreover, annealing in the vertical heat-treating furnace enables coping with recent large-diameter wafers and also enables annihilating crystal defects near a surface layer.

Additionally, according to the present invention, there is provided a method for evaluating a silicon single crystal wafer, wherein surface roughness of the silicon single crystal wafer is measured by using an AFM, and an amplitude (an intensity) of a frequency band corresponding to a wavelength of 20 nm to 50 nm is calculated to evaluate presence/absence of degradation in an oxide dielectric breakdown voltage.

Since GOI when a gate oxide film has a thickness of several nm is dependent on the amplitude of the frequency band corresponding to a wavelength of 20 nm to 50 nm obtained by measuring the surface roughness by the AFM, when presence/absence of degradation in GOT is evaluated by using this amplitude, measuring the silicon single crystal wafer surface by the AFM can substitute for evaluation of the degradation in GOI without actually forming an MOS structure on the surface, whereby the presence/absence of the degradation in GOI can be very easily evaluated.

At this time, it is preferable that a result of the evaluation is determined as absence of degradation if a relationship of $y<0.00096e^{-15X}$ is met or the result of the evaluation is determined as presence of degradation if the relationship is not met, where X (nm$^{-1}$) is a frequency and y (nm$^2$) is the amplitude (the intensity) when a waveform of a measurement value obtained by measuring the surface roughness by using the AFM is subjected to Fourier transformation.

When the amplitude y (nm$^2$) of the frequency band corresponding to a wavelength of 20 nm to 50 nm at the time of Fourier-transforming the waveform obtained by measuring surface roughness by the AFM meets the relationship $y<0.00096e^{-15X}$ where X (nm$^{-1}$) is a frequency, degradation in GOI is suppressed in this silicon single crystal wafer even though a gate oxide film is thin. Contrary, in the silicon single crystal wafer that does not meet this relationship, the degradation in GUI occurs. Therefore, presence/absence of the degradation in GOI of the silicon single crystal wafer can be further easily evaluated based on whether this relational expression is met or not met.

As described above, according to the present invention, there can be provided the silicon single crystal wafer having no degradation in GUI even though a thickness of the gate oxide film is as small as several nm, the manufacturing method thereof, and the evaluating method that can easily and accurately evaluate absence of degradation in GOI as compared with the TDDB method and others.

BEST MODE(S) FOR CARRYING OUT THE INVENTION

The present invention will now be more specifically described hereinafter.

As explained above, in recent years, degradation in GOI has been observed in a thickness of a gate oxide film is small even though each wafer having a small Ra value, and a countermeasure for this problem has been waited.

Thus, the present inventors conducted the following examination in regard to a cause of the degradation in GOI when a thickness of the gate oxide film is as small as several nm.

First, GOI evaluation was performed to measure a Qbd value with respect to each of four nitrogen-doped silicon single crystal annealed wafers A that were subjected to Ar annealing in a vertical heat-treating furnace and have excellent surface roughness (Ra=0.10 nm) (which will be also referred to as condition A wafers hereinafter), three defect-free silicon single crystal wafers B having excellent surface roughness (Ra=0.08 nm) (which will be also referred to as condition B wafers hereinafter), and three nitrogen-doped silicon single crystal annealed wafer C that were subjected to Ar annealing in the vertical heat-treating furnace and then sacrificial oxidation/HF solution cleaning and have a regular surface roughness level (Ra=0.12 nm) (which will be also referred to as condition C wafers hereinafter), and a cause of the degradation in GOI and parameters that link to the degradation were examined.

As described above, it has been considered that a wafer having no degradation in GOI can be obtained even though the gate oxide film is thin if the Ra value is not greater than 0.1 nm.

However, the present inventors evaluated GOI of the condition A wafer subjected to the Ar annealing in the vertical heat-treating furnace under conditions that the gate oxide film has a thickness of 5 nm, and they discovered that the degradation occurs even though the Ra value is as excellent as 0.1 nm. Further, they also discovered that the degradation in GOI does not occur in the condition C wafer likewise subjected to the Ar annealing processing in the vertical heat-treating furnace even though the Ra value is not equal to or below 0.1 nm. It is to be noted that they also found out that the Ra is excellent and the degradation in GOI is suppressed in the condition B wafer like conventional examples.

Thus, the present inventors considered that a parameter different from the Ra values concerns the degradation in GOI, conducted various kinds of examinations, and discovered that an amplitude intensity in a specific frequency band in a surface roughness relates to a Qbd value.

Figure 1:
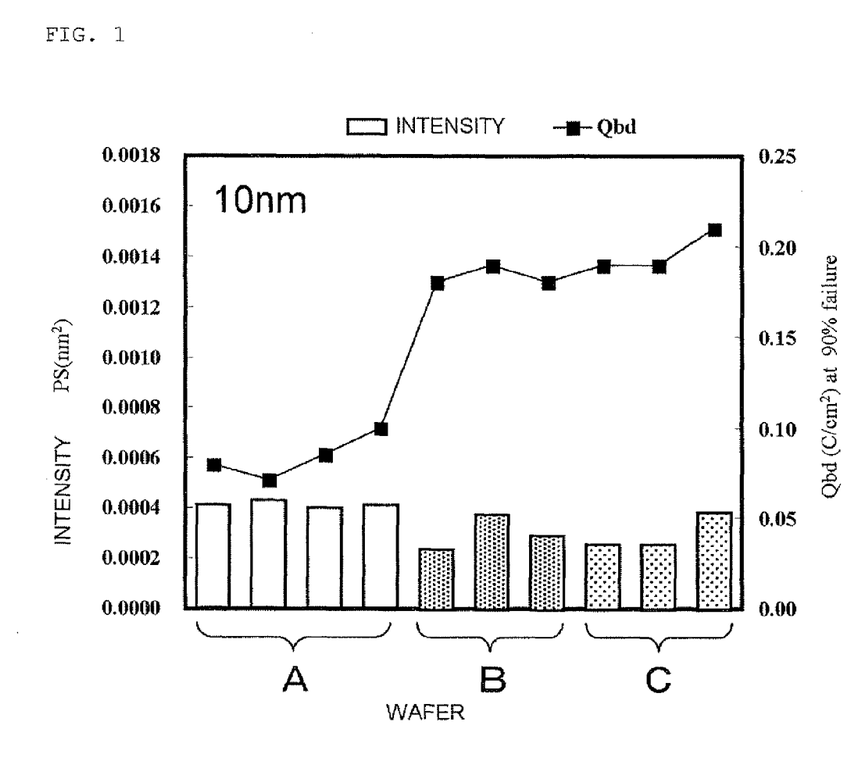
FIG. 1 is a graph showing an amplitude intensity of a frequency corresponding to a wavelength of 10 nm and a Qbd value when surface roughness of a silicon single crystal wafer meeting each of conditions A to C is measured by an AFM and a wavelength is Fourier-transformed.
Figure 2:
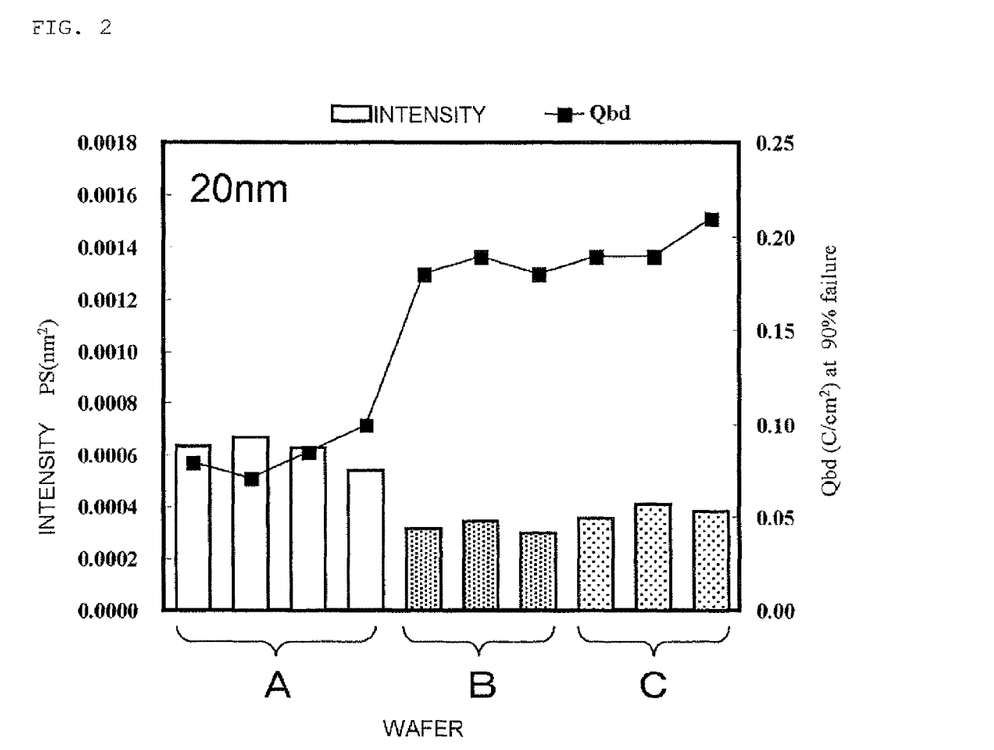
FIG. 2 is a graph showing an amplitude intensity of a frequency corresponding to a wavelength of 20 nm and a Qbd value when surface roughness of a silicon single crystal wafer meeting each of conditions A to C is measured by an AFM and a wavelength is Fourier-transformed.
Figure 3:
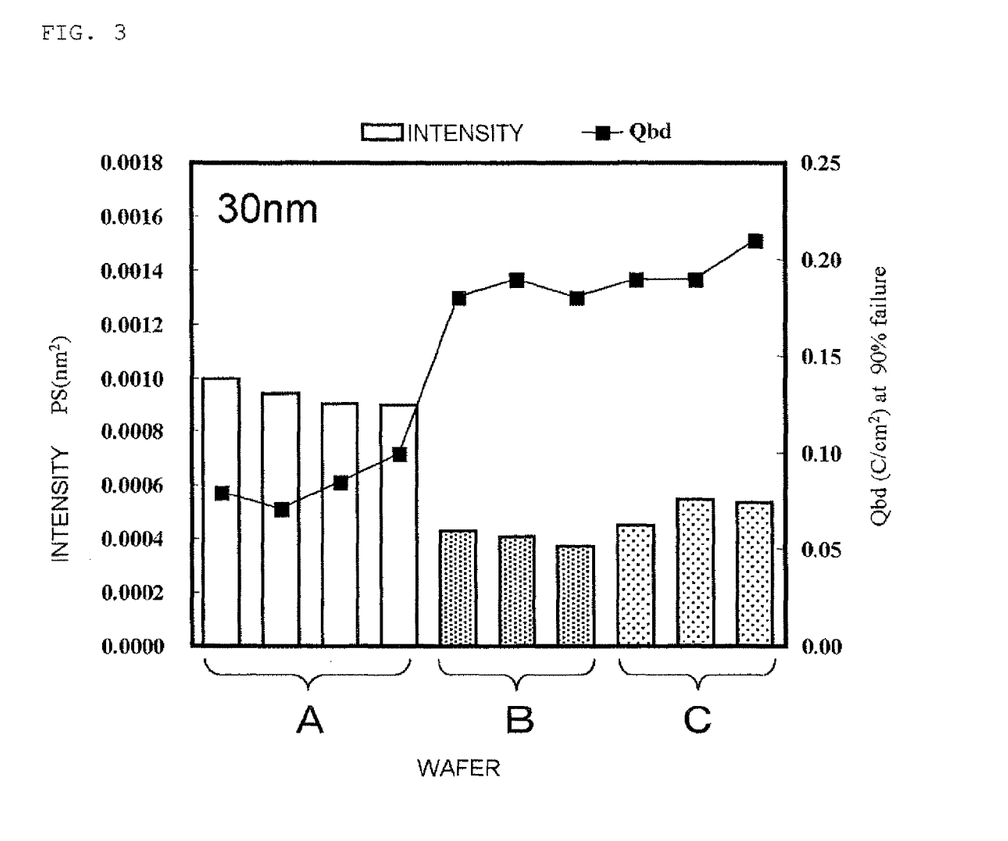
FIG. 3 is a graph showing an amplitude intensity of a frequency corresponding to a wavelength of 30 nm and a Qbd value when surface roughness of a silicon single crystal wafer meeting each of conditions A to C is measured by an AFM and a wavelength is Fourier-transformed.
Figure 4:
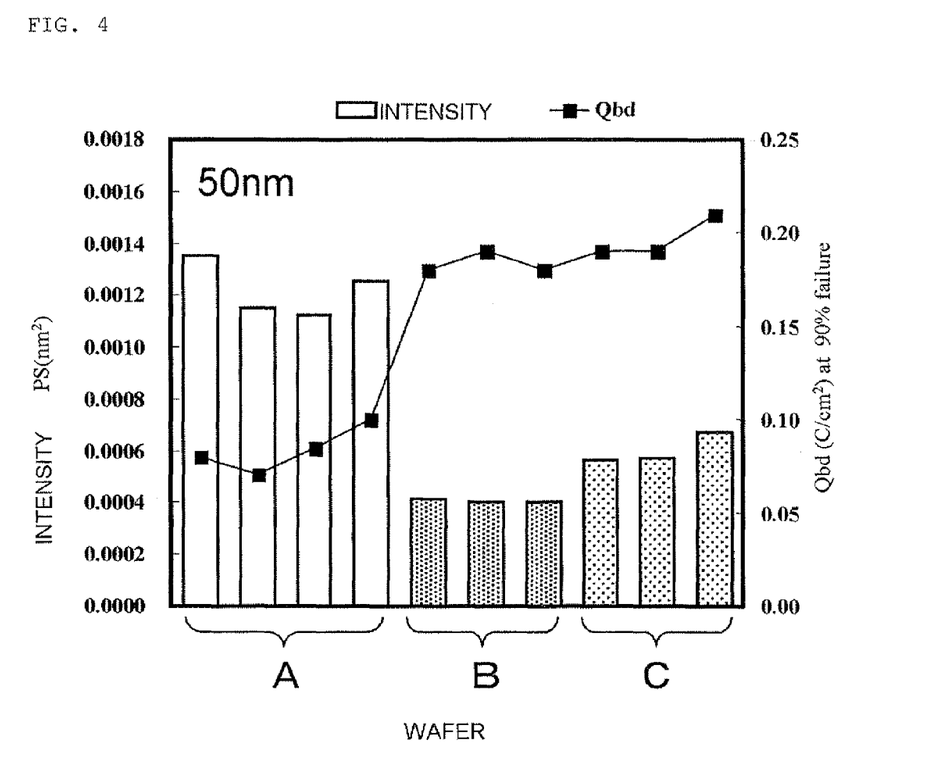
FIG. 4 is a graph showing an amplitude intensity of a frequency corresponding to a wavelength of 50 nm and a Qbd value when surface roughness of a silicon single crystal wafer meeting each of conditions A to C is measured by an AFM and a wavelength is Fourier-transformed.
Figure 5:
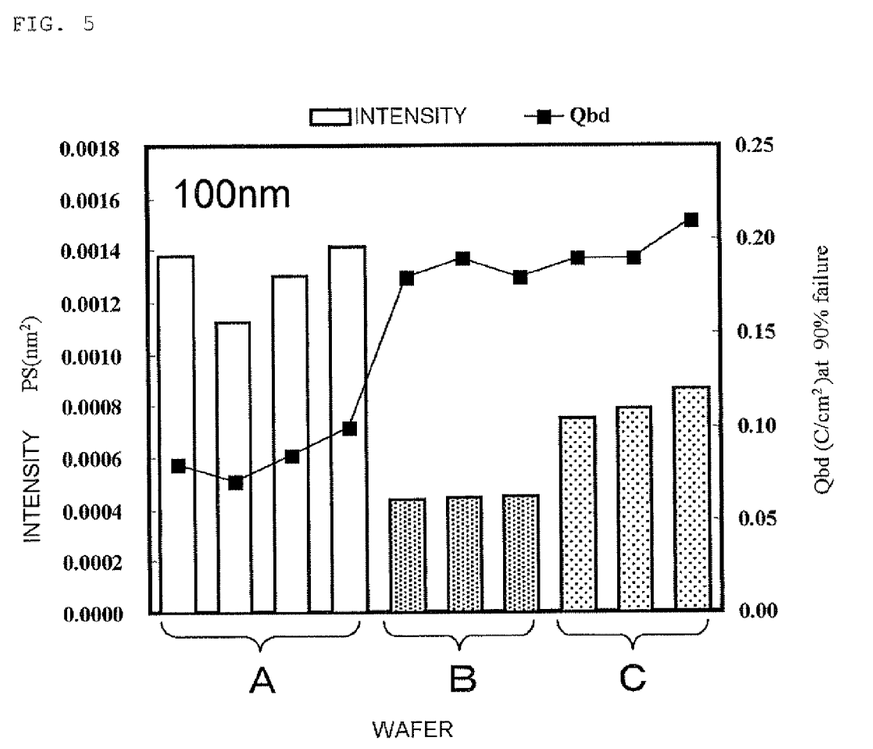
FIG. 5 is a graph showing an amplitude intensity of a frequency corresponding to a wavelength of 100 nm and a Qbd value when surface roughness of a silicon single crystal wafer meeting each of conditions A to C is measured by an AFM and a wavelength is Fourier-transformed.
Figure 6:
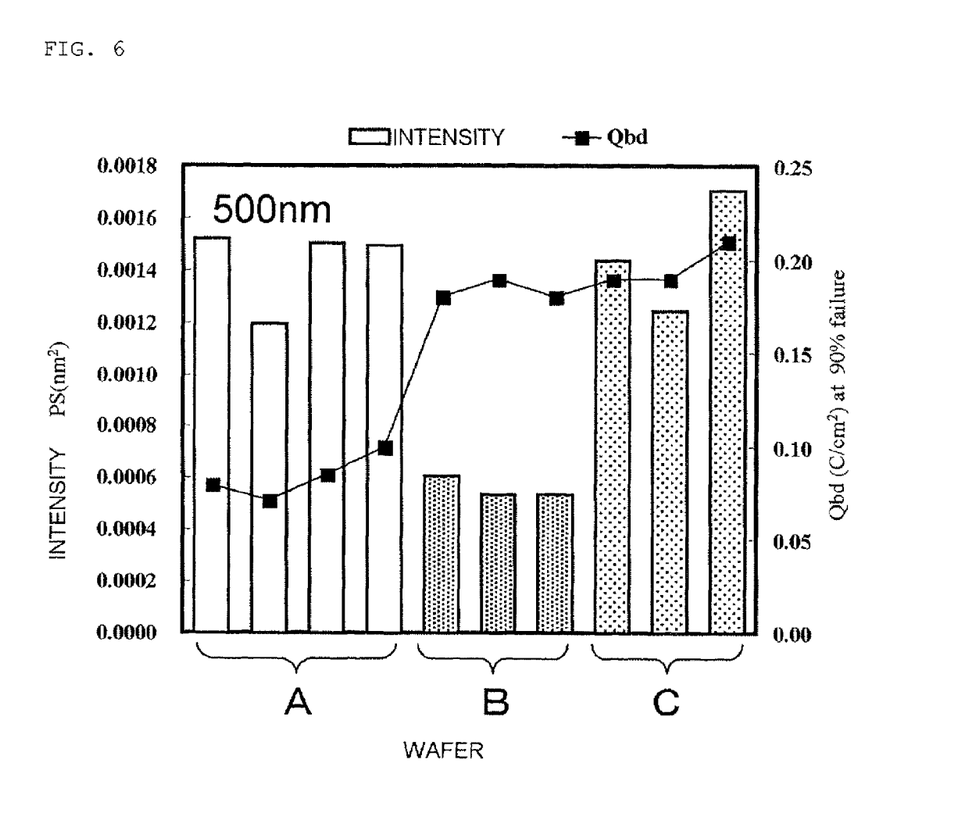
FIG. 6 is a graph showing an amplitude intensity of a frequency corresponding to a wavelength of 500 nm and a Qbd value when surface roughness of a silicon single crystal wafer meeting each of conditions A to C is measured by an AFM and a wavelength is Fourier-transformed.

Description will be specifically given with reference to FIGS. 1 to 6. FIG. 1 is a graph showing an amplitude intensity of a frequency corresponding to a wavelength of 10 nm and a Qbd value when surface roughness of a silicon single crystal wafer meeting each of conditions A to C is measured by the AFM and a waveform is subjected to Fourier transformation. FIG. 2 is a wavelength of 20 nm; FIG. 3 is a wavelength of 30 nm; FIG. 4 is a wavelength of 50 nm; FIG. 5 is a wavelength of 100 nm; and FIG. 6 is a graph showing an amplitude intensity of a frequency corresponding to a wavelength of 500 nm and a Qbd value.

As shown in FIG. 1, although the amplitude intensity of the frequency corresponding to the wavelength 10 nm in the wafers meeting the conditions A to C is substantially equal in all the wafers, it was revealed that the condition A wafer has a small Qbd value and intensive degradation in GOI. On the other hand, it can be understood that each of the wafers meeting the conditions B and C has a large Qbd value and less degradation.

Furthermore, as shown in FIG. 2, it was discovered that the condition A wafer having the small Qbd value has amplitude corresponding to the wavelength of 20 nm that is larger than those of the wafers meeting the conditions B and C. Likewise, as shown in FIG. 3 and FIG. 4, it was revealed that Qbd does not become small and the degradation in GOI is suppressed in the wafers meeting the conditions B and C each having the small amplitude intensity of the frequency corresponding to the wavelength of 30 nm or the wavelength of 50 nm.

In the condition C wafer, although the amplitude intensity of the frequency corresponding to the further increased wavelength of 100 nm is large, the Qbd value is not small, and it can be considered that they have no relation. Moreover, in the condition C waver, although the amplitude intensity of the frequency corresponding to the wavelength of 500 nm is substantially equal to that in the condition A wafer having the small Qbd value, the degradation in GUI does not occur.

Based on the above-described observation, what concerns a reduction in the Qbd value, i.e., occurrence of the degradation in GOI is not the Ra value but the amplitude of the frequency corresponding to the wavelength of 20 nm to 50 nm at the time of evaluating the surface roughness by the AFM, and it was discovered that the silicon single wafer having no degradation in GUI can be assumed if the amplitude of this frequency band is small even though the gate oxide film has a small thickness.

Additionally, the present inventors further conducted detailed examination about a relationship that is met by a small amplitude of a frequency (the frequency is 0.02 to 0.05 [$nm^{-1}$]) corresponding to a wavelength of 20 nm to 50 nm and results in no degradation in GOI. At this time, as evaluation of GOI, TDDB characteristics evaluation at the time of applying a current of 1 mA/$cm^2$ at 100° C. was conducted, and a wafer having a Qbd value that is not smaller than 0.18 C/$cm^2$ at a cumulative failure rate of 90% was determined to be acceptable.

Figure 7:
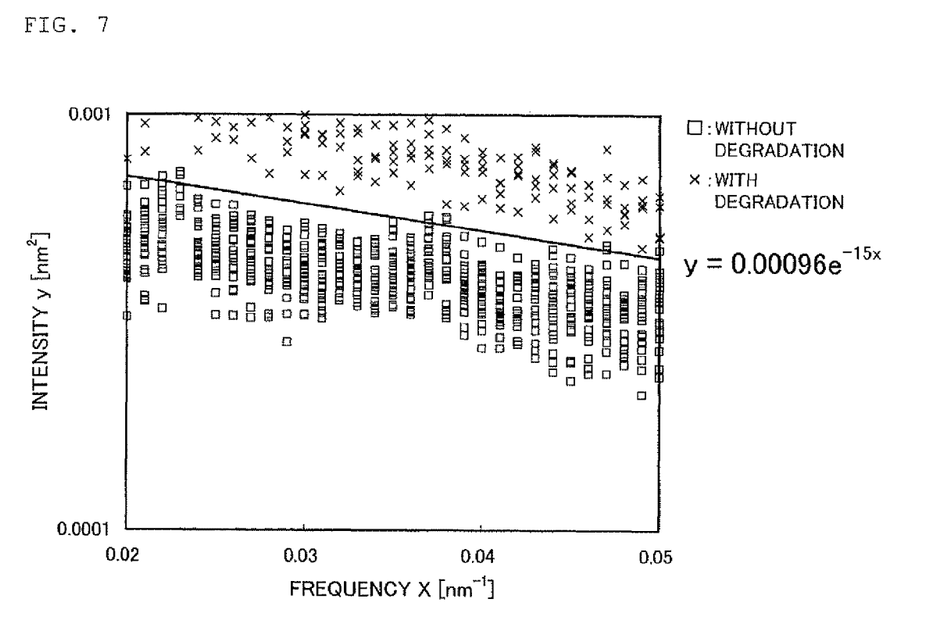
FIG. 7 is a graph showing a relationship between a frequency and an amplitude and a relationship between the results of these evaluation and presence/absence of degradation of GOI when a waveform obtained by evaluating surface roughness by an AFM is subjected to Fourier transformation.

Consequently, as shown in FIG. 7, when an abscissa represents a frequency X ($nm^{-1}$) whilst an ordinate represents an amplitude (an intensity) y ($nm^2$) and a wafer having no degradation in GUI is plotted as □ whilst a wafer having degradation in GOI is plotted as x, it was discovered that an intensity of the wafer having no degradation in GOI highly accurately satisfies the relationship of $y<0.00096e^{-15X}$.

Further, based on the above-described knowledge, the present inventors obtained an idea that presence/absence of degradation in GOI can be easily evaluated without forming a surface MOS structure by measuring surface roughness by the AFM and acquiring an amplitude (an intensity) of a frequency band corresponding to a wavelength of 20 nm to 50 nm to make a judgment of acceptance/rejection and that a silicon single crystal wafer in which degradation in GOI is suppressed can be manufactured by incorporating a step of making the above-described judgment into a manufacturing process, thereby bringing the present invention to completion.

Hereinafter, the present invention will be explained more in detail. However, the present invention is not restricted thereto.

In a silicon single crystal wafer according to the present invention, at the time of measuring surface roughness of a surface of the silicon single crystal wafer by an AFM, an amplitude (an intensity) of a frequency band corresponding to the wavelength of 20 nm to 50 nm meets a relationship of $y<0.00096e^{-15X}$, where X ($nm^{-1}$) is a frequency and y ($nm^2$) is the amplitude (the intensity) when the wavelength is subjected to Fourier transformation.

As described above, at the time of measuring the surface roughness by using the AFM, the silicon single crystal wafer according to the present invention in which the amplitude (the intensity) of the frequency band corresponding to the wavelength of 20 nm to 50 nm meets the relationship of $y<0.00096e^{-15X}$, where X ($nm^{-1}$) is a frequency and y ($nm^2$) is the amplitude (the intensity) when the wavelength is subjected to Fourier transformation, substantially has no degradation in GOI that is dependent on the surface roughness even though a gate oxide film is thin.

Here, the silicon single crystal wafer according to the present invention can be obtained by being subjected to annealing in a vertical heat-treating furnace.

Although the wafer annealed in the vertical heat-treating furnace that facilitates formation of a thin uneven oxide film on a surface when taken out from the heat-treating furnace as described above is an annealed wafer having surface roughness that is apt to be deteriorated by cleaning, this wafer can be a silicon single crystal wafer having no degradation in GOI if the above-described relationship defined in the present invention is met even though a gate oxide film is thin.

Furthermore, such a silicon single crystal wafer according to the present invention can be manufactured by the following manufacturing method. However, the present invention is not restricted thereto.

First, a silicon single crystal ingot is prepared. A general ingot can be prepared as this silicon single crystal ingot, and this ingot can be grown based on, e.g., the Czochralski method.

Then, the prepared silicon single crystal ingot is sliced to provide a plurality of sliced substrates. This slicing can be performed by a general method, and slicing can be performed by using a cutting device such as an inner diameter slicer or a wire saw.

Furthermore, at least one of lapping, etching, and polishing is performed with respect to the plurality of obtained sliced substrates to provide substrates. The lapping, the etching, and the polishing can be performed under general conditions, and they can be appropriately selected in accordance with a specification of a silicon single crystal wafer to be manufactured.

Here, an annealing heat treatment can be performed with respect to the plurality of fabricated substrates in the vertical heat-treating furnace. It is desirable to use an argon 100% atmosphere for this annealing heat treatment.

When the annealing heat treatment is performed in the vertical heat-treating furnace, a thin oxide film having an uneven film thickness is apt to be formed on a substrate surface when taken out from the heat-treating furnace. When RCA cleaning is performed with respect to such the annealed substrate, etching is effected with respect to not only the oxide film but also silicon of the substrate, thus deteriorating surface roughness. Since a gate oxide film is as thick as approximately 25 nm in conventional examples, this surface roughness is not a problem, but the deterioration in this surface roughness results in occurrence degradation of GOI when the gate oxide film is as thin as several nm. However, the degradation in GOI is judged in the manufacturing method according to the present invention even though annealing is performed, thereby manufacturing the silicon single crystal wafer having degradation in GOI suppressed therein. It is to be noted that performing the heat treatment with respect to the silicon wafer in the argon atmosphere enables reforming, e.g., removal of a crystal defect on the wafer surface.

Then, at least one substrate is sampled from the plurality of processed substrates in order to evaluate the surface roughness by using the AFM. As the substrate to be sampled at this time, selecting a substrate sliced out from an arbitrary position of the ingot can suffice, and the position does not have to be specified in particular.

Thereafter, the surface roughness of the sampled substrate is evaluated by using the AFM.

Moreover, an amplitude (an intensity) of a frequency band corresponding to a wavelength of 20 nm to 50 nm is obtained from an evaluation value to judge whether the substrate is accepted/rejected.

At this time, in the judgment of acceptance/rejection, the substrate can be determined as an accepted piece if the relationship of $y<0.00096e^{-15X}$ is met, where X ($nm^{-1}$) is a frequency and y ($nm^2$) is the amplitude (the intensity) at the time of performing Fourier transformation to a waveform of a measurement value obtained by measuring the surface roughness by the AFM, and the substrate can be determined as a rejected piece if the same relationship is not met.

The degradation in GOI in a case where the gate oxide film is as thin as several nm can be evaluated based on whether the relationship of $y<0.00096e^{-15X}$ is met, where X ($nm^{-1}$) is a frequency and y ($nm^2$) is the amplitude (the intensity) when a waveform of a measurement value obtained by measuring the surface roughness by the AFM is subjected to Fourier transformation. Therefore, whether the degradation in GOI is present at the time that the silicon single crystal wafer is manufactured can be easily evaluated in a short time in the manufacturing process. Additionally, in the manufactured silicon single crystal wafer, the degradation in GOI can be suppressed even though the gate oxide film is as thin as several nm.

Further, the processing advances to the next step if the judgment result is acceptance, and reprocessing is performed if the judgment result is rejection. As this reprocessing, it is desirable to perform processing for improving the surface roughness. The silicon single crystal wafer is manufactured based on this process.

Here, it is preferable to perform the reprocessing and then sample at least one substrate to evaluate its surface roughness and send other substrates to the next step after determined as an accepted.

Furthermore, the reprocessing can be processing of forming a sacrificial oxide film on each of the plurality of processed substrate and then removing the sacrificial oxide film by using an HF solution.

When the sacrificial oxide film is formed and removed by using the HF solution in this manner, a surface shape can be alleviated, and the surface roughness that affects the degradation in GOI when the gate oxide film is thin can be decreased.

As described above, according to the method for manufacturing a silicon single crystal wafer of the present invention, it is possible to manufacture the silicon single crystal wafer in which the degradation in GOI does not occur even though the gate oxide film is as thin as several nm.

Moreover, a method for evaluating a silicon single crystal wafer according to the present invention will be described hereinafter, but the present invention is not restricted thereto.

First, a silicon single crystal wafer to be evaluated is prepared.

Additionally, surface roughness of the prepared silicon single crystal wafer is measured by using the AFM. Further, an amplitude (an intensity) of a frequency band corresponding to a wavelength of 20 nm to 50 nm is calculated, and presence/absence of degradation in an oxide dielectric breakdown voltage is evaluated.

Here, the degradation can be determined to be absent if the relationship of $y<0.00096e^{-15X}$ is met, where X ($nm^{-1}$) is a frequency and y ($nm^2$) is the amplitude when the waveform is subjected to Fourier transformation, and the degradation can be determined to be present if the relationship is not met.

As described above, the silicon single crystal wafer that the amplitude y ($nm^2$) of the frequency band corresponding to the wavelength of 20 nm to 50 nm when the surface roughness is measured by the AFM and the wavelength is subjected to Fourier transformation meets the relationship of $y<0.00096e^{-15X}$ is a silicon single crystal wafer that has no degradation in GOI even though its gate oxide film is thin. Therefore, when this relational expression is utilized to evaluate presence/absence of degradation in GOI, presence/absence of the degradation in GOI can be easily and highly accurately evaluated.

According to such a method for evaluating a silicon single crystal wafer of the present invention, performing evaluation by using the AFM enables evaluating degradation of GOI as compared with a GOI method that requires forming an MOS structure on a surface. Therefore, the degradation of GOI can be easily and highly accurately evaluated in a short time.

EXAMPLE

The present invention will now be more specifically explained based on an example, but the present invention is not restricted thereto.

EXAMPLE

First, based on the Czochralski method, a nitrogen-doped silicon single crystal ingot having a diameter of 200 mm was prepared, and a pulling rate was adjusted to prepare a defect-free silicon single crystal ingot having an N region on an entire surface thereof. Further, each ingot was sliced by using a wire saw to fabricate a plurality of sliced substrates. Then, etching and polishing were performed with respect to the sliced substrates.

Subsequently, a heat treatment was carried out with respect to the substrates fabricated from the nitrogen-doped silicon single crystal ingot alone in an Ar atmosphere at 1200° C. for one hour by using a vertical furnace.

Then, one annealed substrate and one defect-free silicon single crystal substrate were sampled to measure their surface roughness by using the AFM. Furthermore, waveforms were subjected to Fourier transformation to calculate an amplitude (an intensity) in accordance with each frequency. Table 1 shows a result of this calculation.

TABLE 1

| WAVELENGTH [nm] | ANNEALED SUBSTRATE [$nm^2$] | DEFECT-FREE SILICON SINGLE CRYSTAL SUBSTRATE [$nm^2$] | ANNEALED SUBSTRATE AFTER SACRIFICIAL OXIDATION AND HF [$nm^2$] | $y = 0.00096e^{-15X}$ [$nm^2$] |
|---|---|---|---|---|
| 50.0 | 0.001352 | 0.000520 | 0.000522 | 0.000711 |
| 30.3 | 0.000928 | 0.000387 | 0.000422 | 0.000585 |
| 20.0 | 0.000606 | 0.000246 | 0.000365 | 0.000453 |

Consequently, it was revealed that all amplitudes of frequency bands corresponding to wavelengths of 20 nm to 50 nm in the defect-free silicon single crystal substrate meets a relationship of $y<0.00096e^{-15X}$. On the other hand, it was found out that all amplitudes of frequency bands corresponding to the wavelengths of 20 nm to 50 nm in the annealed substrate do not meet the relationship of $y<0.00096e^{-15X}$ in this manufacture.

Thus, a sacrificial oxide film having a thickness of 150 nm was formed to each of some of annealed substrates that were not sampled based on pyrogenic oxidation in a pyrogenic atmosphere at 950° C., and then each of substrates having the sacrificial oxide film formed thereon were immersed in an HF solution having a concentration of 5% to remove the sacrificial oxide film.

Moreover, Table 1 shows a result obtained by again sampling one substrate and measuring its surface roughness by using the AFM to perform the same calculation.

Consequently, it was revealed that all amplitudes of frequency bands corresponding to wavelengths of 20 nm to 50 nm in the sacrificial oxide film removed substrate meet the relationship of $y<0.00096e^{-15X}$.

Additionally, final finishing process was performed with respect to each manufactured substrate to provide a silicon single crystal wafer.

A gate oxide film having a thickness of 5 nm was formed on each of the annealed wafer (without sacrificial oxidation), the defect-free silicon single crystal wafer, and the sacrificial oxide film removed wafer to judge whether the fabricated silicon single crystal wafers have degradation of GOI, and TDDB characteristics were evaluated to evaluate each oxide dielectric breakdown voltage. At this time, TDDB characteristic evaluation at the time of applying a current of 1 $mA/cm^2$ at 100° C. was performed as the evaluation of GOI, and a wafer having a Qbd value of 0.18 $C/cm^2$ or above at a cumulative failure rate of 90% was determined as an acceptable piece.

As a result, the GOI was degraded in the annealed wafer, but the defect-free silicon single crystal wafer and the sacrificial oxide film removed wafer have no degradation of GOI, and hence they have excellent oxide dielectric breakdown voltages.

It is to be noted that the present invention is not restricted to the foregoing embodiment. The foregoing embodiment is just an exemplification, and any examples that have substantially the same configuration and exercise the same functions and effects as the technical concept described in claims according to the present invention are included in the technical scope of the present invention.

The invention claimed is:

1. A method for manufacturing a silicon single crystal wafer, comprising at least:
   a step of preparing a silicon single crystal ingot;
   a step of slicing the silicon single crystal ingot to fabricate a plurality of sliced substrates;
   a processing step of processing the plurality of sliced substrates into a plurality of substrates by performing at least one of lapping, etching, and polishing;
   a step of sampling at least one from the plurality of substrates;
   a step of measuring surface roughness of the substrate sampled at the sampling step by an AFM and obtaining an amplitude (an intensity) of a frequency band corresponding to a wavelength of 20 nm to 50 nm to make a judgment of acceptance; and
   a step of sending the substrate to the next step if a judgment result is acceptance or performing reprocessing if the judgment result is rejection;
   wherein the judgment of acceptance result is acceptance if a relationship of $y<0.00096e^{-15x}$ is met or the judgment of acceptance result is rejection if the relationship is not met, where X ($nm^{-1}$) is a frequency and y ($nm^2$) is the amplitude (the intensity) when a waveform of a measurement value obtained by measuring the surface roughness by using the AFM is subjected to Fourier transformation.

2. The method for manufacturing a silicon single crystal wafer according to claim 1,
   wherein the reprocessing is processing of forming a sacrificial oxide film on each of the plurality of processed substrates and then removing the sacrificial oxide film by using an HF solution.

3. The method for manufacturing a silicon single crystal wafer according to claim 1,
   wherein an annealing heat treatment is carried out in a heat-treating furnace between the processing step and the sampling step.

4. The method for manufacturing a silicon single crystal wafer according to claim 2,
   wherein an annealing heat treatment is carried out in a heat-treating furnace between the processing step and the sampling step.

5. A method for evaluating a silicon single crystal wafer, wherein:
   surface roughness of the silicon single crystal wafer is measured by using an AFM, and an amplitude (an intensity) of a frequency band corresponding to a wavelength of 20 nm to 50 nm is calculated to evaluate presence/absence of degradation in an oxide dielectric breakdown voltage, and
   a result of the evaluation is determined as absence of degradation if a relationship of $y<0.00096e^{-15x}$ is met or the result of the evaluation is determined as presence of degradation if the relationship is not met, where X ($nm^-$) is a frequency and y ($nm^2$) is the amplitude (the intensity) when a waveform of a measurement value obtained by measuring the surface roughness by using the AFM is subjected to Fourier transformation.

* * * * *